US006977127B2

(12) United States Patent
Shiah et al.

(10) Patent No.: US 6,977,127 B2
(45) Date of Patent: Dec. 20, 2005

(54) ALTERNATING PHASE SHIFT MASK

(75) Inventors: Chii-Ming Shiah, Jubei (TW); Yi-Yu Hsu, Taipei (TW); Yu-Cheng Tung, Kaohsiung (TW); Hung-Yueh Liao, Ilan (TW); Kao-Tsai Tsai, Kaohsiung (TW); Jong-Bor Wang, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 184 days.

(21) Appl. No.: 10/320,243

(22) Filed: Dec. 16, 2002

(65) Prior Publication Data

US 2003/0134207 A1 Jul. 17, 2003

(30) Foreign Application Priority Data

Jan. 17, 2002 (TW) ....................................... 91100666 A

(51) Int. Cl.[7] .............................. G03F 9/00; G03C 5/00
(52) U.S. Cl. ........................................... 430/5; 430/394
(58) Field of Search ............................. 430/5, 22, 322, 430/394

(56) References Cited

U.S. PATENT DOCUMENTS

| | | | | |
|---|---|---|---|---|
| 6,440,614 B1 * | 8/2002 | Sonoda | .......................... | 430/5 |
| 2003/0203291 A1 * | 10/2003 | Misaka | .......................... | 430/5 |

FOREIGN PATENT DOCUMENTS

| | | |
|---|---|---|
| JP | 07-013326 | 1/1995 |
| JP | 07-230160 | 8/1995 |

* cited by examiner

*Primary Examiner*—S. Rosasco
(74) *Attorney, Agent, or Firm*—Birch, Stewart, Kolasch & Birch, LLP

(57) ABSTRACT

An alternating phase shift mask. The alternating phase shift mask includes a transparent substrate, a light-shielding layer disposed on the transparent substrate to define a transparent array consisting of a plurality of first phase rows and a plurality of second phase rows alternately interposed between the first phase rows. The alternating phase shift mask further comprises a phase interference enhancement feature disposed a predetermined distance from the outermost row of the transparent array, wherein the phases of the phase interference enhancement feature and the outermost row are reverse.

18 Claims, 4 Drawing Sheets

ALTERNATING PHASE SHIFT MASK

Pursuant to 35 U.S.C. § 119(a)–(d), this application claims priority from Taiwanese application no. 091100666, filed on Jan. 17, 2001.

BACKGROUND OF THE INVENTION

1. Field of the Invention

The present invention relates to a photolithography technology to fabricate semiconductor devices, more particularly, to an alternating phase shift mask (alt. PSM) capable of reducing or eliminating pattern deformation without repeated engineering efforts.

2. Description of the Related Art

Photolithography is widely used in the semiconductor industry to form a wide range of structures in integrated circuit chips. As the size of the chips decreases, optical phenomena such as diffraction and interference become increasingly important as they can adversely affect the resolution of the photolithography rendering further reduction in size and increases in density more difficult to realize. To minimize such phenomena and extend the range of photolithography, a technique known as phase shift mask (PSM), based on phase destructive interference of the waves of incident light, was developed. Phase shift mask shifts the phase of one region of incident light waves approximately 180 degree relative to an adjacent region of incident light waves to create a more sharply defined interface between the adjacent regions than is otherwise possible.

Recently, alternating phase shift masks have been adopted and investigated in patterning storage nodes of dynamic random access memory (DRAM). The alternating phase shift masks include row-type, column-type, and checker-board type. FIG. 1 and FIG. 3 show an alternating phase shift mask with row-type according to the prior art.

As shown in FIGS. 1 and 3, the alternating phase shift mask 30 includes a transparent substrate 1 consisting of quartz materials and a chromium light-shielding layer 3 disposed on the transparent substrate 1. The light-shielding layer 3 has a transparent array consisting of a plurality of first phase (0 degree) rows I and a plurality of second phase (180 degree) rows II alternately interposed between the first phase rows I.

FIG. 2 is a top view showing the photoresist pattern transferred from the alternating phase shift mask 30 of FIG. 1. Storage node array 10, transferred by the transparent array of the alternating phase shift mask 30, is formed on the photoresist layer. The storage nodes 10*a* transferred by the outermost transparent rows 20, 22 (the top row and bottom row) tend to pattern deformation. This can result in worse critical dimension (CD) control at the DRAM array edge.

One method to compensate for the pattern deformation is to use a specific mask having a modification factor for the outermost rows or columns. However, the modification factor of the specific mask needs to be optimized by repeated engineering efforts such as experience and simulation.

Therefore, there remains a need for an improved alternating phase shift mask to compensate for the storage node deformation caused by the outermost transparent rows.

SUMMARY OF THE INVENTION

In view of the above disadvantages, an object of the invention is to provide an alternating phase shift mask capable of reducing or eliminating pattern deformation without repeated engineering efforts.

In accordance with one aspect of the invention, there is provided an alternating phase shift mask. The alternating phase shift mask comprises a transparent substrate, a light-shielding layer disposed on the transparent substrate to define a transparent array consisting of a plurality of first phase rows and a plurality of second phase rows alternately interposed between the first phase rows. The alternating phase shift mask further comprises a phase interference enhancement feature disposed a predetermined distance from the outermost row of the transparent array, wherein the phases of the phase interference enhancement feature and the outermost row are reverse.

Alternately, in accordance with another aspect of the invention, the transparent array consists of a plurality of first phase columns and a plurality of second phase columns alternately interposed between the first phase columns.

In accordance with another aspect of the invention, the first phase rows (columns) are 0 degree, and the second phase rows (columns) are 180 degree.

In accordance with yet another aspect of the invention, the transparent substrate is preferably a quartz substrate. The light-shielding layer preferably consists of chromium or its alloy.

In accordance with a still further aspect of the invention, the phase interference enhancement feature is preferably single transparent stripe, parallel stripe, or a plurality of transparent blocks.

In accordance with the further aspect of the invention, the transparent stripe preferably has a width of about 50 nanometers to about 80 nanometers. Furthermore, the phase interference enhancement feature is disposed 50 to 200 nanometers from the outermost row of the transparent array.

Alternately, if a photomask whose magnification is 4-times is used, the transparent stripe preferably has a width of about 200 nanometers to about 320 nanometers. Furthermore, the phase interference enhancement feature is disposed 200 to 800 nanometers from the outermost row of the transparent array.

In accordance with another aspect of the invention, the phase interference enhancement feature preferably has a dimension that cannot transfer to a photoresist layer during photolithography.

Unlike conventional alternating phase shift mask, phase interference enhancement feature is easily arranged in the alternating phase shift mask. That is to say, it is not necessary to strictly control the phase interference enhancement feature in its shape, dimension, and the position according to the invention. Therefore, the deformation can be compensated without repeated engineering efforts.

BRIEF DESCRIPTION OF THE DRAWINGS

The preferred embodiment of the invention is hereinafter described with reference to the accompanying drawings in which.

DETAILED DESCRIPTION OF THE INVENTION

The following description will explain the alternating phase shift mask according to the embodiment of the invention, which proceeds with reference to the accompanying drawings.

Figure 1:
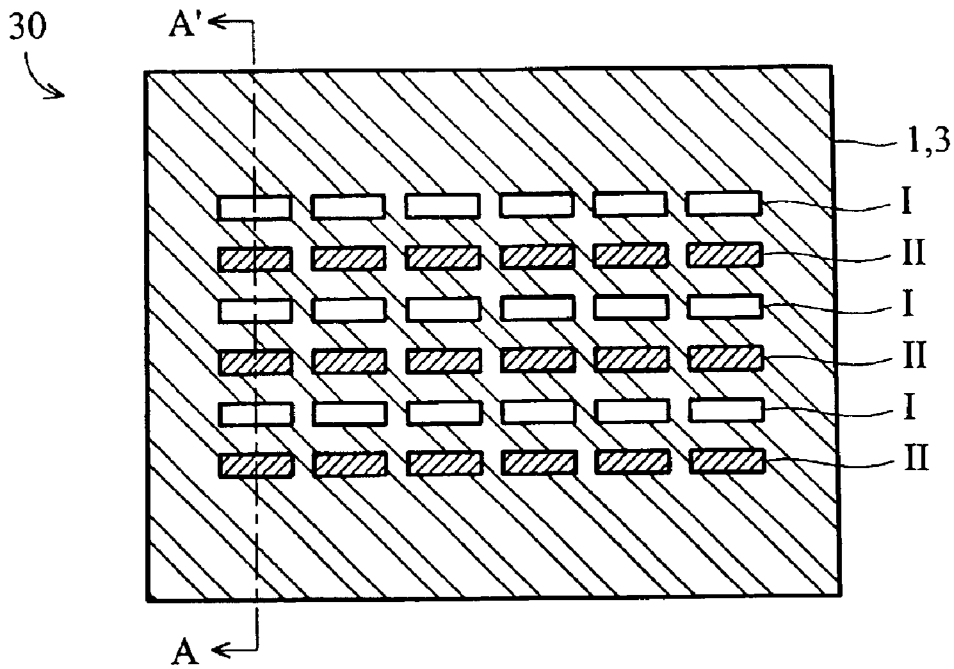
FIG. 1 is top view of an alternating phase shift mask according to the prior art.
Figure 2:
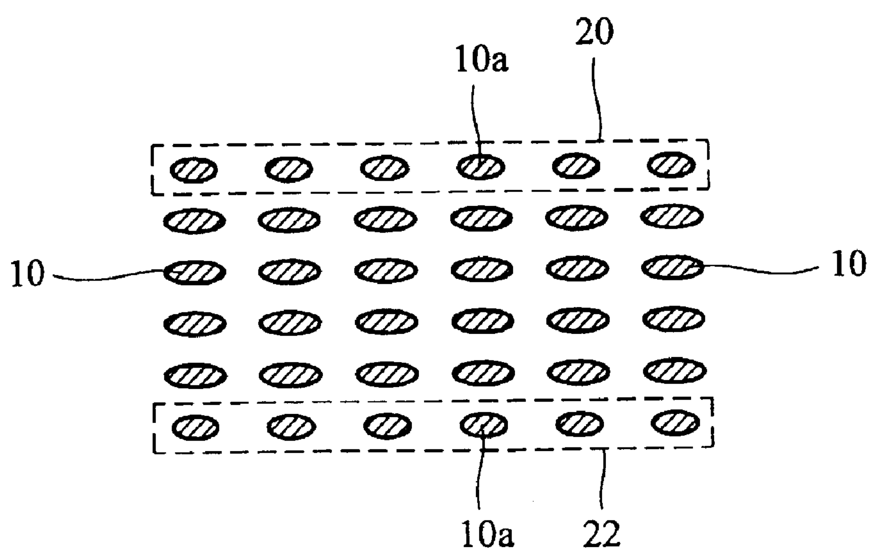
FIG. 2 is a top view showing the photoresist pattern transferred from the alternating phase shift mask of FIG. 1.
Figure 3:
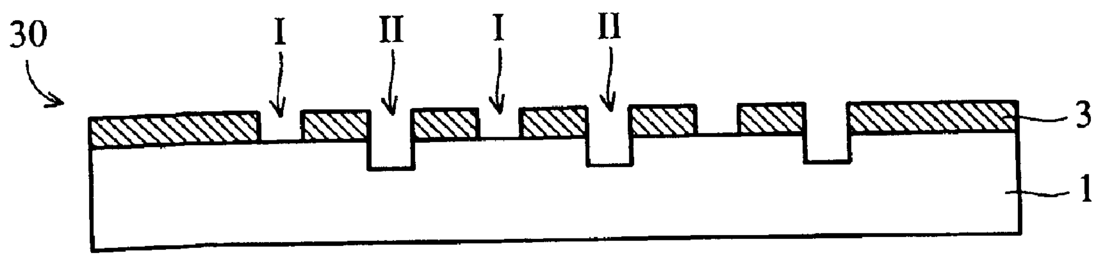
FIG. 3 is a cross-section of A-A' line of FIG. 1.
Figure 4:
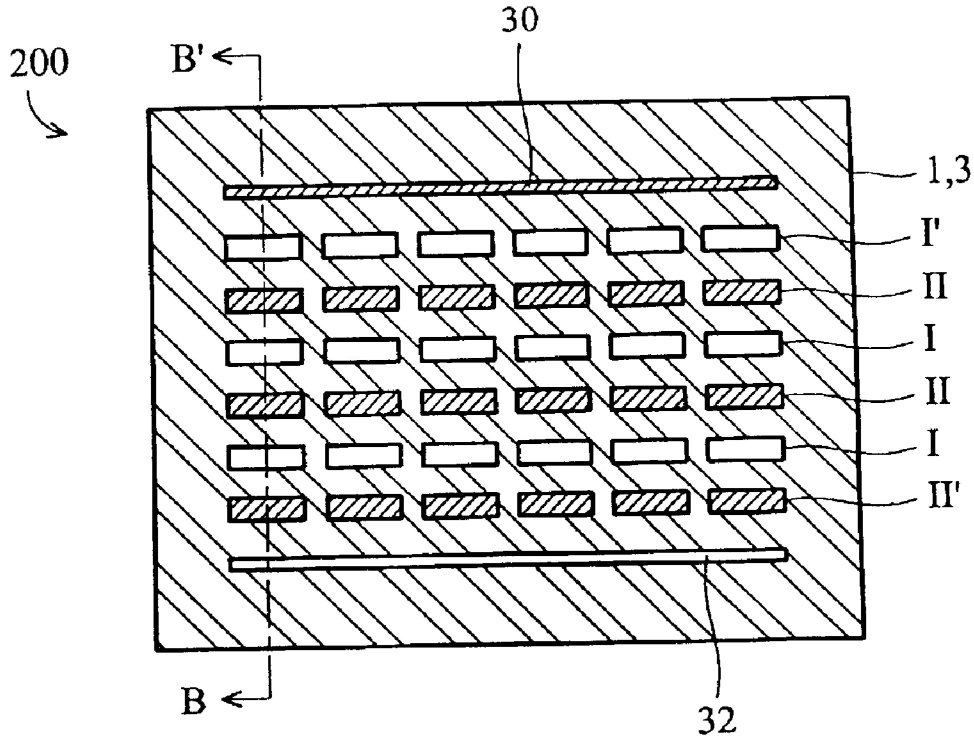
FIG. 4 is top view of an alternating phase shift mask according to the embodiment of the invention.
Figure 6:
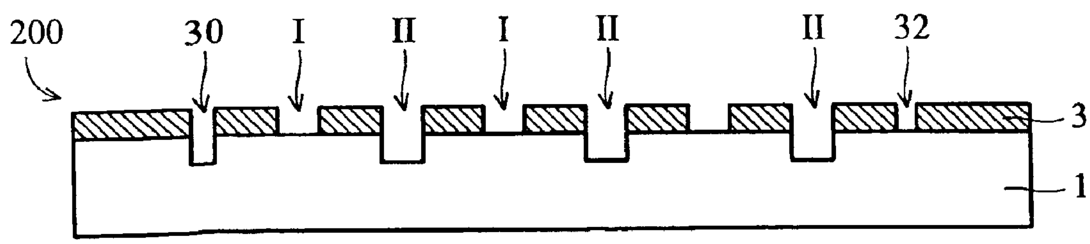
FIG. 6 is a cross-section of B-B' line of FIG. 4.

FIG. 4 and FIG. 6 show an alternating phase shift mask 200 according to the embodiment of the invention. The alternating phase shift mask 200 includes a transparent substrate 1 consisting of quartz materials and a chromium light-shielding layer 3 disposed on the transparent substrate 1. The light-shielding layer 3 has a transparent array consisting of a plurality of first phase (0 degree) rows I and a plurality of second phase (180 degree) rows II alternately interposed between the first phase rows I. The transparent substrate 1 is partially etched to form recesses having a predetermined depth serving as second phase rows as shown in FIG. 6. The transparent array is used to define repeated patterns such as storage nodes of dynamic random access memories (DRAMs) in deep submicron processes, about 0.13 $\mu$m.

Phase interference enhancement features 30, 32 are respectively disposed a distance of about 50 to 200 nm from the outermost rows I' and the outermost rows II' of the transparent array. The phases of the phase interference enhancement features 30 and the adjacent outermost row I' are reverse.

As in the above description, the phase interference enhancement feature 32 and the adjacent row II' have reverse phases. In this embodiment, the phase interference enhancement feature 30 is 180 degree and the phase interference enhancement feature 32 is 0 degree. The phase interference enhancement features 30, 32 are single stripes having a width of about 50 to 80 nanometers so that the patterns of the phase interference enhancement feature 30, 32 are not transferred to the underlying photoresist layer by UV light source.

Figure 5:
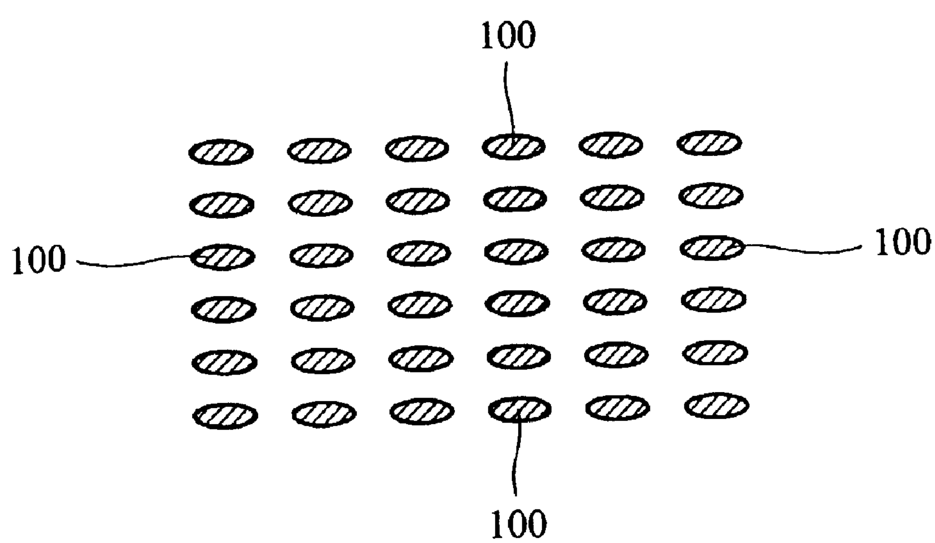
FIG. 5 is a top view showing the photoresist pattern transferred from the alternating phase shift mask of FIG. 4.

FIG. 5 is a top view showing the photoresist pattern transferred from the alternating phase shift mask 200 of FIG. 4. Storage node array 100, transferred by the transparent array of the alternating phase shift mask 200, is formed on the photoresist layer. Unlike the conventional structure, deformation of the outermost storage nodes can be eliminated by means of adding the phase interference enhancement features 30, 32.

Figure 7:
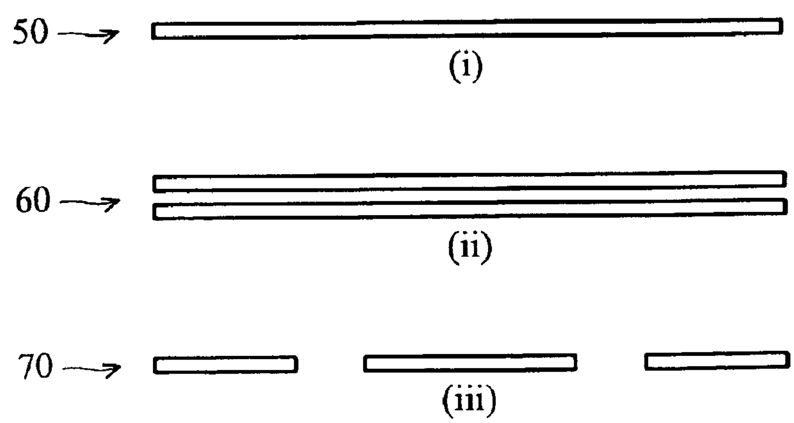
FIG. 7 is a top view of the phase interference enhancement features according to the embodiment of the invention.

FIG. 7 is a top view of the phase interference enhancement features according to the embodiment of the invention. FIG. 7 (i) shows a single transparent stripe 50 as shown in FIG. 4. Alternately, the phase interference enhancement feature can be parallel stripes 60 as shown in FIG. 7 (ii). Furthermore, the phase interference enhancement feature can be multiple transparent blocks 70 as shown in FIG. 7 (iii).

In the embodiment mentioned above, the light-shielding layer 3 has a transparent array consisting of a plurality of first phase (0 degree.) rows I and a plurality of second phase (180 degree.) rows II. The invention is not limited to row-type array, a transparent array, column-type array, consisting of a plurality of columns (0 degree) and a plurality of columns (180 degree) can be used. Phase interference enhancement features, having a reverse phase relative to adjacent region, are also arranged along the outermost columns. In this column-type array, the phase interference enhancement features are arranged along the right side or the left side of the transparent array.

According to the alternating phase shift mask of the invention, the phase interference enhancement features are easily arranged along the transparent array of the light-shielding layer for defining repeated patterns such as storage nodes of DRAM. This alternating phase shift mask is capable of compensating the pattern deformation at the edge array without repeated engineering efforts.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. An alternating phase shift mask, comprising:

a transparent substrate;

a light-shielding layer on the transparent substrate to define a transparent array consisting of a plurality of first phase rows and a plurality of second phase rows alternately interposed between the first phase rows; and a phase interference enhancement feature disposed a predetermined distance from the outermost row of the transparent array, wherein the phases of the phase interference enhancement feature and the outermost row are reverse.

2. An alternating phase shift mask as claimed in claim 1, wherein the transparent substrate is a quartz substrate.

3. An alternating phase shift mask as claimed in claim 1, wherein the light-shielding layer consists of chromium.

4. An alternating phase shift mask as claimed in claim 1, wherein the polysilicon layer, wherein the phase interference enhancement feature is a transparent stripe.

5. An alternating phase shift mask as claimed in claim 4, wherein the polysilicon layer, wherein the transparent stripe has a width of about 50 nanometers to about 80 nanometers.

6. An alternating phase shift mask as claimed in claim 4, wherein the predetermined distance between the outermost row of the transparent array and the phase interference enhancement feature is between 50 nanometers and 200 nanometers.

7. An alternating phase shift mask as claimed in claim 1, wherein the polysilicon layer, wherein the phase interference enhancement feature comprises a plurality of transparent blocks.

8. An alternating phase shift mask as claimed in claim 1, wherein the first phase is 0 degrees and the second phase is 180 degrees.

9. An alternating phase shift mask as claimed in claim 5, wherein the phase interference enhancement feature has a dimension that cannot transfer to a photoresist layer during photolithography.

10. An alternating phase shift mask, comprising:

a transparent substrate;

a light-shielding layer disposed on the transparent substrate to define a transparent array consisting of a plurality of first phase columns and a plurality of second phase columns alternately interposed between the first phase columns; and a phase interference enhancement feature disposed a predetermined distance from the outermost column of the transparent array, wherein the phases of the phase interference enhancement feature and the outermost column are reversed.

11. An alternating phase shift mask as claimed in claim 10, wherein the transparent substrate is a quartz substrate.

12. An alternating phase shift mask as claimed in claim 10, wherein the light-shielding layer consists of chromium.

13. An alternating phase shift mask as claimed in claim 10, wherein the polysilicon layer, wherein the phase interference enhancement feature is a transparent stripe.

14. An alternating phase shift mask as claimed in claim 13, wherein the polysilicon layer, wherein the transparent stripe has a width of about 50 nanometers to about 80 nanometers.

15. An alternating phase shift mask as claimed in claim 13, wherein the predetermined distance between the outermost column of the transparent array and the phase interference enhancement feature is between 50 nanometers and 200 nanometers.

16. An alternating phase shift mask as claimed in claim 10, wherein the polysilicon layer, wherein the phase interference enhancement feature comprises a plurality of transparent blocks.

17. An alternating phase shift mask as claimed in claim 10, wherein the first phase is 0 degree and the second phase is 180 degree.

18. An alternating phase shift mask as claimed in claim 14, wherein the phase interference enhancement feature has a dimension that cannot transfer to a photoresist layer during photolithography.

* * * * *